US008757955B2

(12) United States Patent
Murata et al.

(10) Patent No.: US 8,757,955 B2
(45) Date of Patent: Jun. 24, 2014

(54) STORAGE, TRANSPORTING SYSTEM AND STORAGE SET

(75) Inventors: Masanao Murata, Ise (JP); Takashi Yamaji, Ise (JP)

(73) Assignee: Murata Machinery, Ltd., Kyoto-Shi (JP)

( * ) Notice: Subject to any disclaimer, the term of this patent is extended or adjusted under 35 U.S.C. 154(b) by 527 days.

(21) Appl. No.: 12/205,053

(22) Filed: Sep. 5, 2008

(65) Prior Publication Data

US 2009/0065460 A1   Mar. 12, 2009

(30) Foreign Application Priority Data

Sep. 6, 2007  (JP) ................................. 2007-231862
Sep. 6, 2007  (JP) ................................. 2007-231868
Sep. 6, 2007  (JP) ................................. 2007-231870

(51) Int. Cl.
*B65G 1/00* (2006.01)

(52) U.S. Cl.
USPC ........................................... 414/281; 212/71

(58) Field of Classification Search
USPC ............ 414/280, 281, 282, 225.01, 267, 277, 414/279, 940, 331.01, 331.08, 331.09, 414/331.1, 331.11, 222.07, 411; 212/332, 212/71, 328, 330; 104/106; 211/162, 183, 211/283
See application file for complete search history.

(56) References Cited

U.S. PATENT DOCUMENTS

| | | | |
|---|---|---|---|
| 6,739,820 B2 | 5/2004 | Chang et al. | |
| 6,746,197 B2 * | 6/2004 | Kimura et al. | 414/217 |
| 7,261,510 B2 * | 8/2007 | Motoori et al. | 414/281 |
| 7,356,378 B1 | 4/2008 | Huang et al. | |
| 7,409,263 B2 * | 8/2008 | Elliott et al. | 700/218 |
| 7,578,650 B2 | 8/2009 | Aalund et al. | |
| 7,695,234 B2 * | 4/2010 | Yamashita | 414/277 |
| 2004/0042878 A1 | 3/2004 | Watanabe et al. | |
| 2004/0149672 A1 | 8/2004 | Motoori et al. | |

(Continued)

FOREIGN PATENT DOCUMENTS

| | | |
|---|---|---|
| EP | 1 134 641 | 3/2001 |
| JP | 05-047896 | 2/1993 |

(Continued)

OTHER PUBLICATIONS

United States Official Action—U.S. Appl. No. 12/253,291—Dec. 16, 2011.

(Continued)

*Primary Examiner* — Saul Rodriguez
*Assistant Examiner* — Glenn Myers
(74) *Attorney, Agent, or Firm* — Young & Thompson

(57) ABSTRACT

A storage (10) is provided with a supporting portion (11) capable of supporting a load (3), a horizontal driving portion (13) capable of moving said supporting portion back and forth in a horizontal one direction, a vertical driving portion (14) capable of moving said supporting portion back and forth in a vertical direction, and a rack (15) having a plurality of putting surfaces, each being capable of transferring said load mutually with said supporting portion, said putting surfaces being disposed at a plurality of stages in the vertical direction to each of which said supporting portion can access by said horizontal driving portion, one or more than one of said putting surfaces being disposed at a horizontal position to which said supporting portion can access by said horizontal driving portion. At least one of said putting surfaces functions as a port for unloading and loading said load.

11 Claims, 8 Drawing Sheets

(56) References Cited

U.S. PATENT DOCUMENTS

| | | |
|---|---|---|
| 2004/0191046 A1* | 9/2004 | Mitsuyoshi ............ 414/754 |
| 2005/0036856 A1 | 2/2005 | Yamashita |
| 2005/0191162 A1 | 9/2005 | Chang et al. |
| 2009/0104006 A1* | 4/2009 | Murata et al. ......... 414/225.01 |

FOREIGN PATENT DOCUMENTS

| | | |
|---|---|---|
| JP | 06-239422 | 8/1994 |
| JP | 07-196108 | 8/1995 |
| JP | 9-315521 | 12/1997 |
| JP | 10-250836 | 9/1998 |
| JP | 11-310306 | 11/1999 |
| JP | 2000-91401 | 3/2000 |
| JP | 2001-002208 | 1/2001 |
| JP | 2002-231785 | 8/2002 |
| JP | 2003-150247 | 5/2003 |
| JP | 2003-182815 | 7/2003 |
| JP | 2004-238191 | 8/2004 |
| JP | 2006-049454 | 2/2006 |
| JP | 2007-022677 | 2/2007 |
| JP | 2007-186320 | 7/2007 |

OTHER PUBLICATIONS

U.S Official Action from corresponding U.S. Appl. No. 12/253,291 dated Sep. 8, 2011.

* cited by examiner

STORAGE, TRANSPORTING SYSTEM AND STORAGE SET

BACKGROUND OF THE INVENTION

1. Field of the Invention

The present invention relates to a storage such as a stocker for temporarily storing a load (i.e., a transported object or an object), such as a FOUP (Front Opening Unified Pod) for accommodating or housing various substrates for manufacturing semiconductor elements and the like, at the position located close to a track, in a traveling system for transporting the load on the track. Here, the "load" (i.e., the "transported object" or "object") in the present invention means a products an intermediate product, a part, an article, a work, a partly-finished good, a good or the like (e.g, a semiconductor or LCD device), or means a box or container for containing such a product or the like (e.g, a container containing the semiconductor or LCD device), which has been transported or is to be transported by the transporting carriage. The load may be a carrier for containing an object to be carried such as a FOUP.

2. Description of the Related Art

This kind of storage is installed close to a track on which a transporting carriage such as a vehicle travels for example. In the storage, a lot of rack portions are installed so as to store a lot of loads which are transported or to be transported by the transporting carriage. Further, a transporting apparatus in a storage, which is called as a "stacker robot", a "stacker crane" or the like, is provided to perform the transportation of the load between a "port" and the assigned or designated rack portion (i.e., to perform transportation within the storage). The "port" is to perform the delivery-and-receipt or the taking-out and putting-in of the load (i.e., loading and unloading of the load) between the inside of such a storage and the transporting carriage. Especially, the transportation within the storage including a lot of rack portions arranged crisscross is made possible by the stacker robot or the like (refer to Japanese Patent Application Publication Laying Open No. 2006-049454 and 2003-182815).

On the other hand, as this kind of storage, there is a storage, which is relatively compact, and in which a load is directly transferred (i.e., loaded and unloaded) from a transporting carriage of ceiling hanging type onto a rack stage capable of going up and down along the side of rack portions, which are vertically arranged by a plurality of levels, In this storage, when a load is unloaded (i.e., taken-out from the storage), the load is directly transferred from the rack stage capable of going up and down, to the transporting carriage (refer to Japanese Patent Application Publication Laying Open No. 2004-238191).

SUMMARY OF THE INVENTION

However, according to the storage in each of the above described related arts NO. 2006-049454 and 2003-182815, firstly, there is such a technical problem that the control and the structure of the transporting apparatus in the storage, such as a stacker robot or the like are basically complicated and highly sophisticated, and thus the transporting apparatus in the storage costs high and also costs time and money for its maintenance.

Further, according to the storage in each of the above described related arts NO. 2006-049454 and 2003-182815, secondly, for maintenance of the storage, saving the space of about 1 meter around the storage is needed. Thus except when the time for maintenance, such a space, between the storages installed along a track, or between the storage and a manufacturing apparatus and the like, becomes useless. Above that, for arranging the storage as one of the large scale facility in a factory, it is required to bring various parts into the factory, assemble the brought various parts and install the assembled parts to be the storage.

On the other hand, according to the storage in the above described related art No. 2004-238191, the going up and down rack stage itself becomes a port for unloading and loading. Thus, when loading, it takes a certain time period to hang a load down from a transporting carriage, position the hung load until the going up and down rack stage and put the positioned load down. When unloading, it takes a certain time period to hang a load up from the going up and down rack stage by a transporting carriage. Especially, if the going up and down rack stage is not set at the position for taking-out and putting-in, which is the upper position, it takes a certain time period to move the going up and down rack stage up to the position, Alternatively, it is difficult to take out and put in the load on the going up and down rack stage which is at the lower position. And especially, by the operation for unloading and loading requiring the certain time period in this manner, the going up and down rack stage is exclusively occupied or used. Therefore it is not possible to transport other load in the storage by use of the going up and down rack stage. Additionally, in a mechanism for unloading and loading on such a going up and down rack stage, in which a roller or rollers, a belt or belts and a guide or guides and the like are assembled, there is a technical problem that it is basically difficult to unload and load the load and to transport the load in the storage at high speed, while positioning the going up and down rack stage and the load.

It is therefore an object of the present invention to provide a storage, firstly, which can unload and load a load efficiently by use of a relatively simple structure, or which can transport a load in the storage efficiently.

It is therefore another object of the present invention to provide a storage and a transporting system including the storage, secondly, which can be arranged into a small space along a track, for which the maintenance can be easily done, and which can unload and load a load efficiently by use of a relatively simple structure, or which can transport a load in the storage efficiently.

The above object of the present invention can be achieved by a first storage comprising: a supporting portion capable of supporting a load; a horizontal driving portion capable of moving said supporting portion back and forth in a horizontal one direction; a vertical driving portion capable of moving said supporting portion back and forth in a vertical direction; and a rack having a plurality of putting surfaces, each being capable of transferring said load mutually with said supporting portion, said putting surfaces being disposed at a plurality of stages in the vertical direction to each of which said supporting portion can access by said horizontal driving portion, one or more than one of said putting surfaces being disposed at a horizontal position to which said supporting portion can access by said horizontal driving portion at least one of said putting surfaces functioning as a port for unloading and loading said load.

In the first storage of the present invention, said supporting portion may be a putting portion having a first putting surface capable of supporting said load from bottom side of said load, and each of said putting surfaces may be a second putting surface capable of transferring said load mutually with said first putting surface.

According to the first storage in the present invention, a rack has a plurality of putting surfaces (e.g., a second putting surfaces described later) disposed at a plurality of stages in the vertical direction. For example, there are "m" (in this regard, "m" is a natural number of more than two) stages in the vertical direction, while "n" (in this regard, "n" is a natural number of more than one) line in the horizontal one direction. The "horizontal one direction" means a direction which is horizontal and is fixed as one line with respect to the rack along which the putting surfaces are arranged Only one line in another horizontal one direction (as below, which may be simply called as the "thickness directions") which is perpendicular to the "n" line. In that manner, the structure of whole rack is constructed so as to have a flat plate shape being thin and slender in length. A supporting portion (that is, "a putting portion") may be constructed to be capable of moving the load in two directions or two axes directions (i.e. the vertical direction and the horizontal one direction) by a vertical driving portion and a horizontal driving portion, for example, in condition of putting a load on the first putting surface.

When loading, a load is transferred from a transporting carriage to a second putting surface which functions as a port. Subsequently, the transferred load or the second putting surface which functions as the port is put on a first putting surface in a putting portion which can move in the two axes directions. For example, the first putting surface and the second putting surface are configured respectively to support each different part (typically, central part and surrounding part of the load) in the bottom surface of the load. Either the first putting surface or the second putting surface can support the load. When the putting portion is moved to the vertical position and the horizontal position where the second putting surface which functions as the port exists the load is supported on the first putting surface in place of the second putting surface which functions as the port. Then transferring from the second putting surface to the first putting surface is performed. Typically, the first putting surface is moved to be higher than the second putting surface by the vertical driving portion. By this moving, the load is supported on the first putting surface. Herewith, the transportation in the storage when loading is begun. Here, by simple operation in two axes by the vertical driving portion and the horizontal driving portion, to any second putting surface in the rack, the transportation in the storage can be performed rapidly.

Subsequently, when the putting portion is moved to the vertical position and the horizontal position where the second putting surface which will be used for keeping exists, the load is supported on the second putting surface in place of the first putting surface. Then transferring from the first putting surface to the second putting surface is performed. Typically, the first putting surface is moved to be lower than the second putting surface by the vertical driving portion. By this moving, the load is supported on the second putting surface. Herewith, the transportation in the storage when loading is finished, and the keeping in the rack is started.

Otherwise, when unloading, the putting portion is moved to the vertical position and the horizontal position where the second putting surface on which a load will be unloaded exists. Subsequently, the load is supported on the first putting surface in place of the second putting surface. Then the transferring from the second putting surface to the first putting surface is performed. Typically, the first putting surface is moved to be higher than the second putting surface by the vertical driving portion. By this moving, the load is supported on the first putting surface. Herewith, the transportation in the storage when unloading is begun. Subsequently, the putting portion is moved to the vertical position and the horizontal position where the second putting surface which functions as the port exists. Here, by simple operation in two axes by the vertical driving portion and the horizontal driving portion, from any second putting surface in the rack, the transportation in the storage can be performed rapidly.

Subsequently, the load is supported on the second putting surface which functions as the port in place of the first putting surface. Then the transferring from the first putting surface to the second putting surface which functions as the port is performed. Typically, the first putting surface is moved to be lower than the second putting surface by the vertical driving portion. By this moving, the load is supported on the second putting surface. Herewith, the transportation in the storage when unloading is finished and transferring from the port to the transporting carriage can be performed.

After that, transferring from the port to the transporting carriage is performed by the transporting carriage which is already waiting at the position on the track corresponding to the port, or by the next transporting carriage which will come to this position.

As a result, the port is at least one of second putting surfaces, thus while the putting portion transports in the storage, as long as the load is not put on the second putting surface which functions as the port, transporting from a transporting carriage to the port can be performed. Oppositely, while the putting portion transports in the storage, transporting from the port to a transporting carriage can be performed. Moreover, by the comparatively easy structure and control of the putting portion which moves in the two axes directions by the driving portion, the transporting in the storage can be performed so as not to become any obstruction of transferring between the port and a transporting carriage. Additionally, this storage can be constructed so as to have any extension in the vertical direction and the horizontal one direction and so as to become extremely thinly (for example, the thickness of the same range as the thickness added some width for mechanism to the width for one load) in the thickness direction. Therefore, the storage can be arranged so as to be insert into the comparatively small gap along a track for a transporting carriage, if the thickness direction is properly matched to the small gap. Moreover, the storage can be arranged so as to be line up more than one the thin storage matching to the width of the small gap. Moreover, promoting the miniaturization of the storage, whole of the storage can be move, and especially, doing maintenance for the storage will be easy.

As mentioned above, the storage can be arranged to the comparatively small gap along the track, and doing maintenance for the storage is easy. Thus, it is possible to unload and load or transport in the storage a load efficiently, by use of the easy structure.

Further, when transferring the load, the supporting portion to support the bottom surface of a load is not limited. But the supporting portion may also be structured so as to support or hold a flange and the like provided at the top part of the load.

In another aspect of the first storage of the present invention, said rack has two of said putting surfaces at each of said stages so as to be capable of supporting said load in case that said supporting portion is moved to both lateral sides respectively in said horizontal one direction According to this aspect, for example, there are "m" stages in the vertical direction, "n" lines in the horizontal one direction, and only one line in the thickness direction. In that manner, the structure of whole rack is constructed so as to be formed into a flat plate shape being thin and slender in length. Especially, transporting in the storage between two of the putting surfaces (that is, the second putting surfaces) which exist in each of one same stage can be performed simply and rapidly by moving horizontally by the horizontal driving portion. And that, compared to the manner to install one of the second putting surfaces in each of one same stage, it is possible to promote the capacity of holding in the storage, to use functions of the horizontal driving portion and the vertical driving portion effectively and also, to promote the efficiency of transporting a load.

However, even if the rack is constructed to have one of the second putting surfaces in each of the stages so as to be capable of supporting the load when the supporting portion is moved to one lateral side in the horizontal one direction, the efficiency related to the present invention described above can be accordingly racked up.

In another aspect of the first storage of the present invention, at least one of said putting surfaces, which is located at a top stage of said stages in said rack, functions as said port.

According to this aspect, when the transporting carriage travels on the track which is installed on the upper side of the storage, transferring a load from the transporting carriage to the port will be easy. And the like, transferring a load from the port to the transporting carriage also will be easy. Further, when two of the putting surfaces (that is, the second putting surfaces) exist in the highest stage, both two of the putting surfaces can be functioned as the port respectively, or only one of the putting surfaces can be functioned as the port.

In the above described aspect related to the first and second putting surfaces of the first storage of the present invention, said first putting surface may also function as said port.

By constituting in this manner, not only the second putting surfaces but also the first putting surface functions as the port. Thus an opportunity to unload and load a load can be increased, depending on conditions of the transporting carriage, transferring more rapidly can be performed.

In the above described aspect related to the first and second putting surfaces of the first storage of the present invention, each of said first putting surface and said second putting surface may have a flat shape complemented by each other as viewed from said vertical direction, when said putting portion is moved to one lateral side in said horizontal one direction.

By constructing in this manner, for example, viewed on the flat, if the first putting surface has a horseshoe shape and each of the second putting surfaces has an island shape and the like to occupy the center of the horseshoe shape. Otherwise, conversely, if each of the second putting surfaces has a horseshoe shape and the first putting surface has an island shape and the like to occupy the center of the horseshoe shape. When the putting portion is move to one edge side, that is, when transferring between the first putting surface and the second putting surfaces, viewed on the flat, the first putting surface and the second putting surfaces form respectively the flat shape complemented by each other. Further, the complemented flat surface shape may be a comb dentiform shape not to touch each other and may be a part inclined to center and a part inclined to surround of the center. In any case, a load is supported on either one of putting surfaces. Thus, the first putting surface is moved so as to be higher than the second putting surfaces by the vertical driving portion. Then a load is supported by the first putting surface. Or the first putting surface is moved so as to be lower than the second putting surfaces by the vertical driving portion. Then a load is supported by the second putting surfaces. Therefore, transferring between the putting surfaces can be performed by moving in two axes extremely simply.

Further, even if the first putting surface and the second putting surfaces do not form the complemented flat shape respectively, adopting other supplementary holding mechanism or transferring mechanism, transferring between the first putting surface and the second putting surfaces can be performed.

In the above described aspect related to the first and second putting surfaces of the first storage of the present invention, said load may include a regulated concave part and a regulated convex part in said bottom side, and said first putting surface and said second putting surfaces may include respectively a concave part and a convex part capable of engaging said regulated concave part and said regulated convex part.

By constructing in this manner, by using the regulated concave part and the regulated convex part in the bottom side of a load, transferring between the first putting surface and the second putting surfaces can be performed in the condition of high positioning accuracy. Further, as the concave part and the convex part like this, a concave part and a convex part, installed in the bottom side of a FOUP which holds various substrates when semiconductor manufacturing, is quoted.

In another aspect of the first storage of the present invention, the storage is disposed with respect to a track along which a transporting carriage transports said load, in such a manner that an azimuth of said horizontal one direction is parallel to an azimuth of said track.

According to this aspect, a track is installed inside a factory, along a wall and near to the wall Encumbered with the wall, when a usual storage can not be arranged, the storage of the present invention is arranged as the azimuth of the horizontal one direction becomes parallel to the azimuth of the track. In this case, if the track is away from the wall for only the thickness in the thickness direction of the storage which is easy to be composed thinly, the storage can be arranged without problems. In other words, so as to be away from the wall for only the thickness in the thickness direction of the storage, the track may be installed.

In this aspect, the storage may be disposed in such a manner that said rack is located under said track, and among said two of said putting surfaces, which are located at the top stage of said rack and each of which is said second putting surface, one located upstream of said track may function as said port for loading, and another located downstream of said track may function as said port for unloading.

By constructing in this manner, as soon as a load is transported from a transporting carriage to the port for loading located upstream, the transporting carriage having no load by the transferring moves to the port for unloading located downstream. Then a process that the transporting carriage transfers from the port for unloading to the transporting carriage can be performed. That is, the efficiency of unloading and loading is extremely improved.

As explained above, according to the storage related to the present invention, unloading and loading a load, or transporting a load in the storage can be performed more efficiently by simple structure.

The above object of the present invention can be achieved by a second storage for unloading and loading a load with a transporting carriage which transports said load on a track, said storage comprising: a driving device capable of moving said load back and forth in a horizontal one direction and a vertical direction; and a rack having a plurality of rack portions in said horizontal one direction for each stage over a plurality of stages in said vertical direction, each of said rack portions capable of accommodating or putting said load which is moved by said divine device, said rack being disposed with respect to said track in such a manner that an azimuth of said horizontal one direction perpendicularly crosses to an azimuth of said track.

In one aspect of the second storage of the present invention, said transporting carriage comprises a ceiling traveling type carriage for traveling along said track installed on or at the vicinity of a ceiling, and said rack is disposed with respect to said track to be located below said track.

According to the second storage, when loading, a load is transferred from the transporting carriage, for example, a ceiling traveling carriage, to a port for unloading and loading for the storage. The load, for example, is moved to a desired rack portion by the driving device including a vertical driving portion and a horizontal driving portion, that is, the load is transported in the storage. When unloading, a load is transported in the storage from the desired rack portion by driving devices. After that, the load is moved to the port for unloading and loading for the storage. Then the transferring to the transporting carriage is performed.

Especially in the present invention, the rack has a plurality of rack portions in the horizontal one direction, in each of plural stages arranged in the vertical direction Corresponding to the rack like this, the driving device can move a load back and forth in the horizontal one direction and in the vertical direction. Therefore, by moving in the 2 axes of the vertical direction and the horizontal one direction, transporting a load in the storage from the port for unloading and loading (or another rack portion) to the one rack portion desired among the rack portions which exist in the rack. Otherwise, by moving in the 2 axes of the vertical direction and the horizontal one direction, transporting a load in the storage from the one rack portion desired among the rack portions which exist in the rack to the port for unloading and loading (or other rack portion).

For example, there are "m" (in this regard, "m" is a natural number of more than two) stages in the vertical direction, "n" (in this regard, "n" is a natural number of more than two) lines in the horizontal one direction, and only one line in another horizontal one direction (as below, which is simply called as the "thickness direction") which is perpendicular to the "n" line. In that manner, the structure of the whole rack is formed into a thin flat plate shape.

Here, in general, in a factory, for example, a semiconductor manufacturing factory and the like on which a track is installed, the equipments which perform various processes along a track, and the stockers which are different from the storage, and the like, may be crammed complying with basic requests that various processes are performed in the limited space. Thus, the track is shortened and the speedup of moving between the processes is promoted, and the like. Conversely, a layout of the equipments to install along a track may be designed to be lost as much as possible of the space. Otherwise, the storage called as a "stocker" and the like, basically is large scale and assembled as a part of the equipment in the factory. The change after that assembling is not easy and that, keeping the original layout to diminish the space is extremely difficult. Otherwise, if the storage is a typically large scale storage, the space for maintenance is opened around the storage, for example, for about 1 meter along a track. In other words, the equipments and the like are laid out along a track, so as to diminish the spaces including also the space for the maintenance like this. Excluding time for maintenance, the space can be also called "useless space".

According to the present invention, the rack is arranged to be located downside of a track, and as the azimuth of the horizontal one direction crosses to the azimuth of a track, optimally, crosses perpendicularly to the azimuth of the track. Consequently, by inserting the storage of the present invention, into the space between various equipments and the like in the direction of a track installed in the factory, the storage can be arranged, the arranging is extremely useful. In other words, even if the layout includes some spaces opened to the air between the equipments and the like installed along a track, some spaces can become a tolerance enough by using the second storage in the present invention, Additionally, by moving in the two axes to the rack including the rack portions which are spread thinly in the thickness direction as described above, that is, which exist in each of the stages, the transporting in the storage is performed extremely efficiently Especially, even if the thickness direction is thin, moving between the rack portions existing in each of the stages, can be performed in condition of stopping the movement in the vertical direction, by moving in the horizontal one direction. Additionally, compared to installing one rack portion in one same stage, the capacity of keeping a load can be improved, the movement in the two axes can be used more effectively, and the efficiency of transporting can also be improved.

At the same time, even if the thickness direction is thin in, moving between the rack portions over the stages can be performed by moving a load at the position in the horizontal one direction, where the load can be moved in the vertical direction, after that, by stopping moving in such a horizontal one direction, in this condition, by moving in the vertical direction, and by further moving in the horizontal one direction after that.

Otherwise, when doing maintenance for the storage, by pulling out the storage thinned like this in the direction crossed to a track, and by keeping the storage away from the vicinity of the track where various equipments and the like are crammed, the space for maintenance can be easily made. Thus, like a traditional storage, laying out the space for maintenance around the storage for about 1 meter is no needed In this case, especially, constructing the thinned storage to be able to move the whole of it is enough possible in weight in a practical sense.

As described above, the storage can be arranged so as to be insert into even the relatively small space along the track for the transporting carriage. In this case, the rack is thin in the thickness direction, but the keeping efficiency is extremely high and that, the transporting efficiency is also extremely high. Additionally, arranging so as to line up more than one of this thinned storage in the thickness direction, corresponding to the width of the space is also possible. Additionally, by promoting the miniaturization for the storage, whole of the storage can be moved, especially, doing maintenance for the storage can be made easy. For example, the storage can be spread in the vertical direction and in the horizontal one direction, and can be constructed extremely thinly (for example, the thickness of the same range as the thickness added some width for mechanism to the width for one load) in the thickness direction. Therefore, the storage can be inserted into the space as the thickness.

In another aspect of the second storage of the present invention, said driving device comprising a supporting portion capable of supporting said load; a horizontal driving portion capable of moving said supporting portion back and forth in said horizontal one direction; and a vertical driving portion capable of moving said supporting portion back and forth in said vertical direction, said rack having as said rack portions a plurality of putting surfaces, each being capable of transferring said load mutually with said supporting portion, one or more than one of said putting surfaces being disposed at a horizontal position to which said supporting portion can access by said horizontal driving portion, for each of said stages.

In this aspect, said supporting portion may be a putting portion having a first putting surface capable of supporting said load from bottom side of said load, and each of said putting surfaces may be a second putting surface capable of transferring said load mutually with said first putting surface.

According to this aspect, when loading, for example, the load is transferred from the transporting carriage onto the second putting surface which functions as the port for unloading and loading. Subsequently, the load transferred onto the second putting surface which functions as the port, is put on the first putting surface in the putting portion which can move in the two axes directions. For example, the first putting surface and the second putting surface are configured respectively to support each different part (typically, the central part and the surrounding part) in the bottom surface of a load. Either the first putting surface or the second putting surface can support the load. When the putting portion is moved to the vertical position and the horizontal position where the second putting surface which functions as the port exists, the load is supported on the first putting surface in place of the second putting surface which functions as the port. Then transferring from the second putting surface to the first putting surface is performed. Typically, the first putting surface is moved to be higher than the second putting surface by the vertical driving portion. By this moving the load is supported on the first putting surface. Herewith, the transportation in the storage when loading is begun. Here, by the simple operation in the two axes by the vertical driving portion and the horizontal driving portion, the transportation in the storage can be performed rapidly to any second putting surface in the rack.

Subsequently, when the putting portion is moved to the vertical position and the horizontal position where the second putting surface which will be used for keeping exists, a load is supported on the second putting surface in place of the first putting surface. Then transferring from the first putting surface to the second putting surface is performed. Typically, the first putting surface is moved to be lower than the second putting surface by the vertical driving portion. By this moving, the load is supported on the second putting surfaces Herewith, the transportation in the storage when loading is finished, and the keeping in the rack is started.

Otherwise, when unloading, the putting portion is moved to the vertical position and the horizontal position where the second putting surface is supported a load which will be unloaded exists. Subsequently, the load is supported on the first putting surface in place of the second putting surface. Then the transferring from the second putting surface to the first putting surface is performed. Typically, the first putting surface is moved to be higher than the second putting surface by the vertical driving portion. By this moving, the load is supported on the first putting surface. Herewith, the transportation in the storage when unloading is begun. Subsequently, the putting portion is moved to the vertical position and the horizontal position where the second putting surface which functions as the port exists. Here, by the simple operation in the two axes by the vertical driving portion and the horizontal driving portion, the transportation in the storage can be performed rapidly from any second putting surface in the rack.

Subsequently, the load is supported on the second putting surface which functions as the port in place of the first putting surface. Then the transferring from the first putting surface to the second putting surface which functions as the port is performed. Typically, the first putting surface is moved to be lower than the second putting surface by the vertical driving portion. By this moving, the load is supported on the second putting surface. Herewith, the transportation in the storage when unloading is finished and transferring from the port to the transporting carriage can be performed.

After that, transferring from the port to the transporting carriage is performed by the transporting carriage which is already waiting at the position on the track corresponding to the port for unloading and loading, or by the next transporting carriage which will come to this position.

As the result of the described above, the transportation in the storage can be performed by the relatively easy structure and control of the putting portion which moves in the two axes directions by the driving portion. Additionally, the transportation in the storage by the driving portion also can be performed during transferring between a transporting carriage and the port, the transporting efficiency in the storage is also dramatically advanced.

In another aspect of the second storage of the present invention, at least one of said rack portions in said rack functions as a port for unloading and loading.

In another aspect of the second storage of the present invention, at least one of said putting surfaces, which is located at a top stage of said stages in said rack, functions as said port.

According, to this aspect, when the transporting carriage travels on the track installed on the upper side of the storage, the operation of transferring a load from this transporting carriage to the port will be easy. In the same way, the operation of transferring a load from the port to the transporting carriage also will be easy. In particular, two rack portions exist on the top stage, so both rack portions can be functioned as the port respectively and only one of two rack portions can be functioned as the port.

In another aspect of the second storage of the present invention, said track diverges at the upstream side of the storage, said rack is disposed below said track, and two of said rack portions, located at the top stage of said rack, function respectively as a port for unloading and loading, with respect to the track on the downstream side of a position where said track diverges.

According to this aspect, the port for unloading and loading exist two on the top stage of the storage, doing concurrently the operations for loading (that is, transferring from a transporting carriage to the port) at the two positions, doing concurrently the operations for unloading (that is, transferring from the port to a transporting carriage) at the two positions and doing concurrently the operation for unloading and the operation for loading, and the like, are possible. Thus, the transferring efficiency can be remarkably improved. Additionally, in this case, the characteristics of the storage related to this invention would not be sacrificed. The characteristics are that the storage is thin in the thickness direction and transporting in the storage can be performed by moving in the two axes directions.

The above object of the present invention can be achieved by a first transporting system with a storage comprising: the second storage (in this regard, including various aspects) of the present invention described above; said track; and said transporting carriage.

According to the first transporting system with a storage, the first transporting system includes the storage of the present invention described above, in the storage, the keeping efficiency is extremely high and additionally, the transporting efficiency is also extremely high. The whole of the storage can be moved, especially, doing maintenance for the storage will be easy.

The above object of the present invention can be achieved by a storage set assembled by a plurality of storages each for unloading and loading a load with a transporting carriage which transports said load on a track, each of said storages comprising: a driving device capable of moving said load back and forth in a horizontal one direction and a vertical direction; and a rack having one or a plurality of rack portions in said horizontal one direction for each stage over a plurality of stages in said vertical direction, each of said rack portions capable of accommodating or putting said load which is moved by said diving device, said storages being arranged with respect to said track in such a manner that horizontal one directions of said storages are aligned and ports for unloading and loading said load in said storages are arranged in one line.

According to the storage set in the present invention, when loading, the load is transferred from the transporting carriage to the port for unloading and loading in the individual storage included in the storage set. Then the load is moved to the desired rack portion by, for example, a driving device including a vertical driving portion and a horizontal driving portion. That is, the load is transported in the storage. When unloading, the load is transported in the storage from the desired rack portion by the driving device. After that, the load is moved to the port in the storage set, and transferring to the transporting carriage is performed.

Especially in the present invention, the rack includes one or more than one rack portions in the horizontal one direction, for each of the stages arranged in the vertical direction. Corresponding to the rack like this, the driving device can move the load back and forth in the horizontal one direction and the vertical direction. Therefore, by the operation in the two axes of the vertical direction and the horizontal one direction, the load can be transported in the storage from the port (or, another rack portion) for unloading and loading to the desired rack portion of the existing rack portions. Or by the operation in the two axes of the vertical direction and the horizontal one direction, the load can be transported in the storage from the desired rack portion of the existing rack portions to the port (or, another rack portion) for unloading and loading.

About individual storage, for example, there are "m" (in this regard, "m" is a natural number of more than two) stages in the vertical direction, "n" (in this regard, "n" is a natural number of more than one) lines in the horizontal one direction, and only one line in another horizontal one direction (as below, which is simply called as the "thickness direction") which is perpendicular to the "n" line. In that manner, the structure of whole rack is constructed to be formed into a thin flat plate shape.

Here, in general, in a factory, for example, a semiconductor manufacturing factory and the like on which a track is installed, the equipments which perform various processes along a track, and the stockers which are different from the storage, and the like, may be crammed complying with basic requests that various processes are performed in the limited space, a track is shortened and the speedup of moving between the processes is promoted, and the like. Conversely, a layout of the equipments to install along a track may be designed to be lost as much as possible of the space. Otherwise, the storage called as the "stocker" and the like, basically is large scale and assembled as a part of the equipment in the factory. The change after that assembling is not easy and that, keeping the original layout to diminish the space is extremely difficult. Otherwise, if the storage is a typical large scale storage, the spaces for maintenance is opened to the air, for example, for about 1 meter along the track. In other words, the equipment and the like are laid out along the track, so as to diminish the space including also the space for maintenance like this. Excluding time for maintenance, the space can be also called "useless space".

According to the present invention, the storages are arranged as the horizontal one direction related to horizontal movement at each of the storages is the same and as the port for unloading and loading in each of the plural storages form one line. For this reason, by the transporting carriage which travels on one track, the operation for unloading and loading between any storage through the port will be easy. Or, by a transporting carriage just unloaded to one storage, loading from the next storage can be performed.

Additionally, assembling the storages of number matched to the space between various equipments and the like in the direction along the track installed in a factory, the storage set of the present invention can be arranged to be inserted into the space, and it is extremely convenient in practical use. In other words, even if the space between equipments and the like installed along the track, is designed in large scale or in small scale, when using the storage in the present invention, the space can become a tolerance enough. Additionally, by the operation in the two axes direction to the rack including the rack portions existing thinly in the thickness direction, that is, existing at each of stages, transporting in the individual storage can be performed extremely efficiently. Especially, if the rack is thin in the thickness direction, transporting between the rack portions existing at each of stages can be performed in condition of stopping the movement in the vertical direction, by moving in the horizontal one direction.

At the same time, if the rack is thin in the thickness direction, transporting between the rack portions existing at each of stages can be performed by moving the load at the position in the horizontal one direction, the position where moving in the vertical direction can be performed, after that, by stopping the movement in the horizontal one direction, in this condition, by moving in the vertical direction, and by further moving in the horizontal one direction after that.

On the other hand, when maintenance for the storage, the thinned storage as individual storage is pulled out separately from other storages in the storage set that the storages of only the desired number can be assembled. This pulling can reserve the space for maintenance easily. Like a typical storage, structuring the space for maintenance about 1 meter around the storage is not needed. In this case, especially, constructing to be able to move the whole of the individual storage thinned is possible enough in weight in practical means.

As described above, into relatively small space or large space along a track of a transporting carriage, the storage set can be arranged to be insert arbitrarily. In this case, about the individual storage, its rack is thin in the thickness direction, but its keeping efficiency is extremely high additionally, its transporting efficiency is also extremely high. Additionally, the thinned storages can be arranged in the thickness direction corresponding to the width of the space, this arranging is extremely convenient in the practical use. Further, constructing to pull out the individual storage from the storage set, is extremely easy and the maintenance for each storage is also easy. For example, the storage can be constructed so as to have any extension in the vertical direction and the horizontal one direction and so as to become extremely thinly (for example, the thickness of the same range as the thickness added some width for mechanism to the width for one load) in the thickness direction. Into the space corresponding to the integral multiplication of this thickness and being along a track, inserting the storage set is favorable.

In one aspect of the storage set of the present invention, said driving means comprising: a supporting portion capable of supporting said load; a horizontal driving portion capable of moving said supporting portion back and forth in a horizontal one direction; a vertical driving portion capable of moving said supporting portion back and forth in a vertical direction; and a rack, as said rack portions, for installing more than one said rack portions, each of said plural stages, at horizontal position at which said supporting portion can be come by said horizontal driving portion, and for including plural putting surfaces, each of said plural putting surfaces which is set up to be capable of transferring said load each other with said supporting portion.

In this aspect, said supporting portion is a putting portion including a first putting surface capable of supporting said load from bottom side of said load, and each of said plural putting surfaces is a second putting surface which is set up to be capable of transferring said load each other with said first putting surface.

According to this aspect, when loading, for example, the load is transferred from the transporting carriage onto the second putting surface which functions as the port for unloading and loading. Subsequently, the load transferred onto the second putting surface which functions as the port, is put on the first putting surface in the putting portion which can move in the two axes directions. For example, the first putting surface and the second putting surface are configured respectively to support each different part (typically, the central part and the surrounding part) in the bottom surface of a load. Either the first putting surface or the second putting surface can support the load. When the putting portion is moved to the vertical position and the horizontal position where the second putting surface which functions as the port exists, the load is supported on the first putting surface in place of the second putting surface which functions as the port. Then transferring from the second putting surface to the first putting surface is performed. Typically, the first putting surface is moved to be higher than the second putting surface by the vertical driving portion. By this moving, the load is supported on the first putting surface. Herewith, the transportation in the storage when loading is begun. Here, by the simple operation in the two axes by the vertical driving portion and the horizontal driving portion, the transportation in the storage can be performed rapidly to any second putting surface in the rack.

Subsequently, when the putting portion is moved to the vertical position and the horizontal position where the second putting surface which will be used for keeping exists, the load is supported on the second putting surface in place of the first putting surface. Then transferring from the first putting surface to the second putting surface is performed. Typically, the first putting surface is moved to be lower than the second putting surface by the vertical driving portion. By this moving, the load is supported on the second putting surface. Herewith, the transportation in the storage when loading is finished, and the keeping in the rack is started.

Otherwise, when unloading, the putting portion is moved to the vertical position and the horizontal position where the second putting surface is supported a load which will be unloaded exists. Subsequently, the load is supported on the first putting surface in place of the second putting surface. Then the transferring from the second putting surface to the first putting surface is performed. Typically, the first putting surface is moved to be higher than the second putting surface by the vertical driving portion. By this moving, the load is supported on the first putting surface. Herewith, the transportation in the storage when unloading is begun. Subsequently, the putting portion is moved to the vertical position and the horizontal position where the second putting surface which functions as the port exists. Here, by the simple operation in the two axes by the vertical driving portion and the horizontal driving portion, the transportation in the storage can be performed rapidly from any second putting surface in the rack.

Subsequently, the load is supported on the second putting surface which functions as the port in place of the first putting surface. Then the transferring from the first putting surface to the second putting surface which functions as the port is performed. Typically, the first putting surface is moved to be lower than the second putting surface by the vertical driving portion. By this moving, the load is supported on the second putting surface. Herewith, the transportation in the storage when unloading is finished and transferring from the port to the transporting carriage can be performed.

After that, transferring from the port to the transporting carriage is performed by the transporting carriage which is already waiting at the position on the track corresponding to the port for unloading and loading, or by the next transporting carriage which will come at the position.

As the result of the described above, the transportation in the storage can be performed by the comparatively easy structure and control of the putting portion which moves in the two axes directions by the driving portion. Additionally, the transportation in the storage by the driving portion also can be performed during transferring between the transporting carriage and the port, the transporting efficiency in the storage is also dramatically advanced.

In another aspect of the storage set of the present invention, the storage set is disposed with respect to said track in such a manner that said one line is arranged along said track.

In this aspect, said transporting carriage may comprises a ceiling traveling type carriage for traveling along said track installed on or at the vicinity of a ceiling, and said rack may be disposed with respect to said track to be located below said track.

According to this aspect, the ports for unloading and loading line up along the track. Then, by the transporting carriage (e.g., a ceiling traveling carriage) which travels on one track, the operation for loading (i.e., transferring from the transporting carriage to the port) and the operation for unloading (i.e., transferring from the port to the transporting carriage) can be performed to the port of any stage. Thus the transferring efficiency can be improved extremely. Additionally, in this case, the obtained profit described above is not impaired by arranging the storages along the track, each of the storages is thin in the thickness direction and can perform transporting in the storage by moving in the two axes directions.

In another aspect of the storage set of the present invention, the storage set is disposed with respect to said track in such a manner that an azimuth of said horizontal one direction perpendicularly crosses to an azimuth of said track.

According to this aspect, it is possible to use most efficiently the space existing long the track. Additionally, the "cross perpendicularly or cross at right angles" said here means a literal orthographic ideally, as long as the space can be effectively used, and means including the case of about viewing as being orthographic, that is, being virtually orthographic as well. Further, when the track is not straight, the "cross perpendicularly or cross at right angles" means including the case of crossing at substantially right angles to the tangential direction at each point on the track.

In another aspect of the storage set of the present invention, at least one of said plural rack portions which are located on the top stage in said rack, functions as said port.

According to this aspect, when the transporting carriage travels on the track installed on the upper side of the storage, the operation of transferring the load from the transporting carriage to the port will be easy. In the same way, the operation of transferring the load from the port to the transporting carriage will be easy. Additionally, when two of the rack portions exist on the top stages both of the two rack portions can be functioned as the port respectively, and only one of the two rack portions can be functioned as the port.

The above object of the present invention can be achieved by a second transporting system with a storage comprising the storage set (in this regard, including its various aspects) of the present invention described above; said track; and said transporting carriage.

According to the second transporting system with the storage, the system includes the storage set of the present invention described above. Thus it is possible to arrange the storage along a track without the useless space, or effectively. At the same time, in each storage, its keeping efficiency is extremely high and that, its transporting efficiency is also extremely high. Pulling out each storage separately from other storages in the storage set is possible, especially, also doing maintenance for each storage will be easy.

The effect and other profit in the present invention are clarified from a best mode or embodiments to perform. The best mode or embodiments are described as follows.

DETAILED DESCRIPTION OF THE PREFERRED EMBODIMENTS

Referring to the accompanying drawings, an embodiment of the present invention will be now explained.

<First Embodiment>

Figure 1:
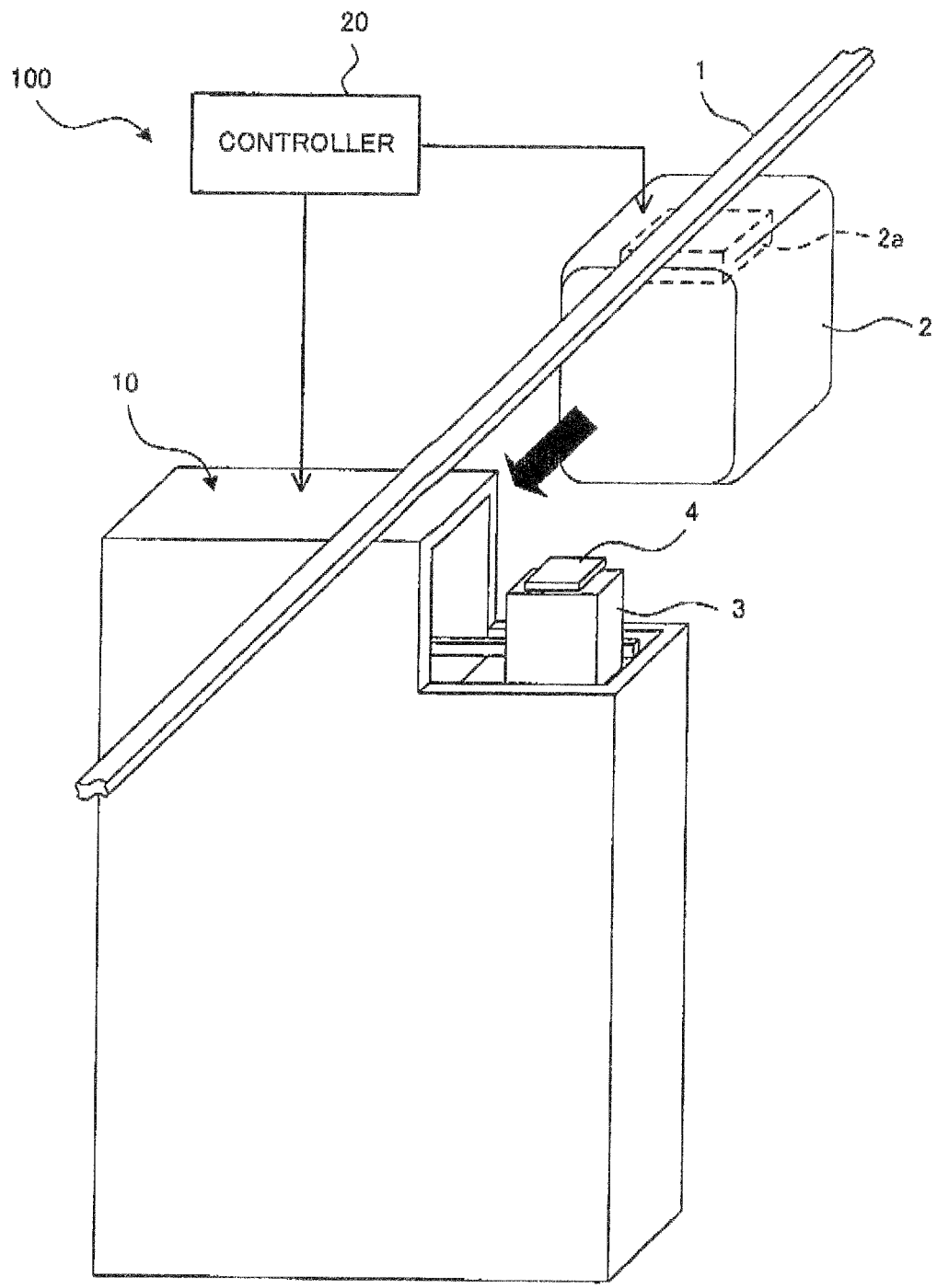
FIG. 1 is a perspective view showing an appearance of a transporting system including a storage, in the first embodiment of the present invention.
Figure 2:
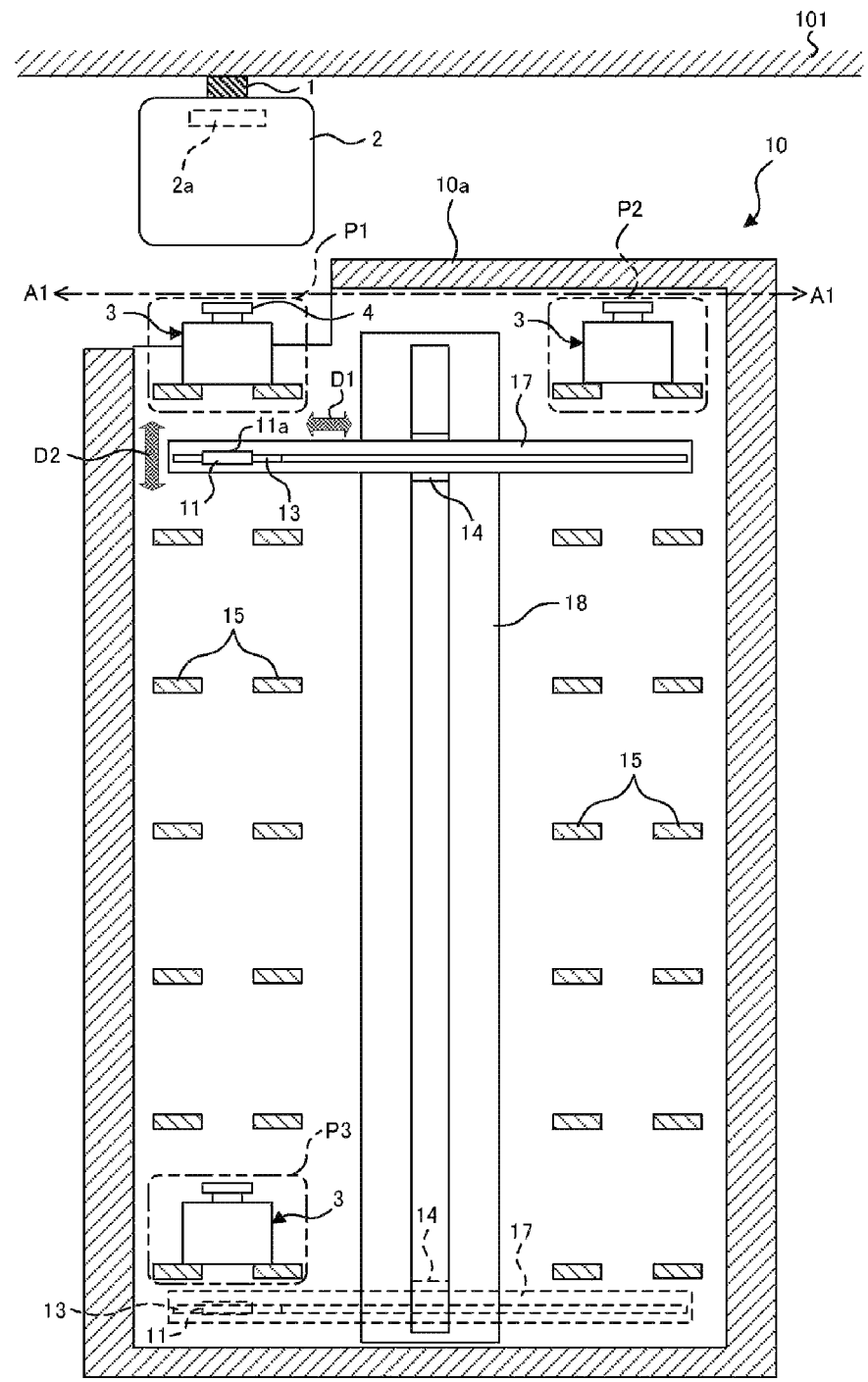
FIG. 2 is a cross sectional view showing an internal construction of the storage shown in FIG. 1.
Figure 3A:
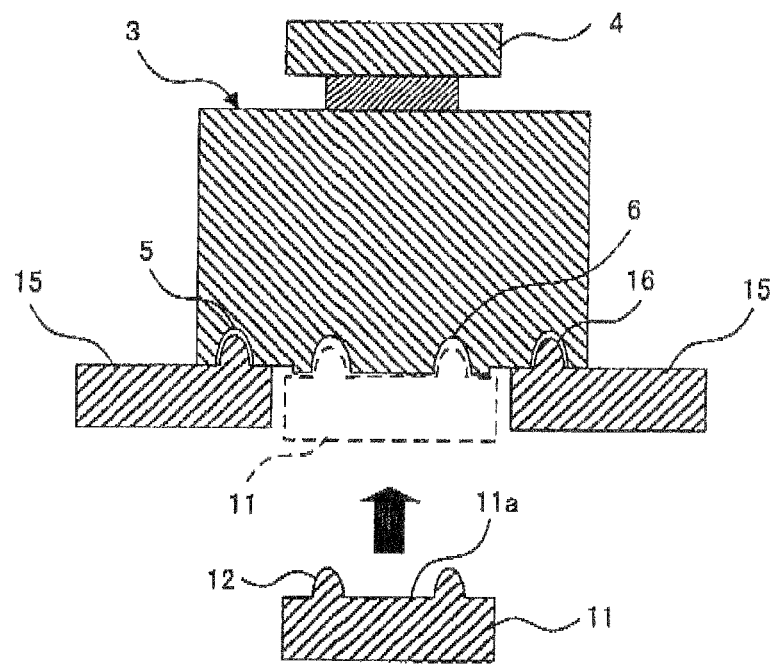
FIG. 3A is a cross sectional view showing an engaging condition of the first and second putting surfaces, in the first embodiment in one state.
Figure 3B:
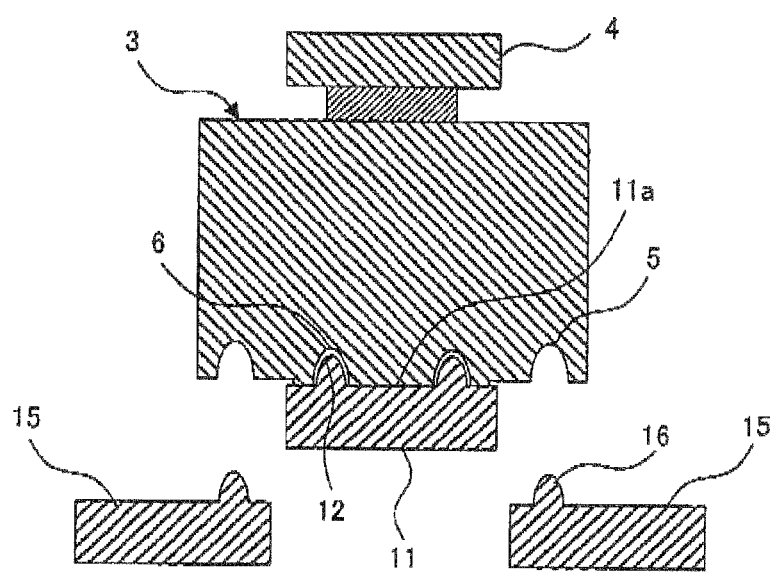
FIG. 3D is a cross sectional view showing an engaging condition of the first and second putting surfaces, in the first embodiment in another state.

At first, the structure of the storage in the first embodiment will be explained referring to FIG. 1 to FIG. 3B. FIG. 1 shows an appearance of a transporting system including a storage in the first embodiment, FIG. 2 shows the internal construction of the storage shown in FIG. 1, and each of FIG. 3A and FIG. 3B shows an engagement condition of the first and second putting surfaces in the first embodiment, with respect to a load.

Especially, the first embodiment is one embodiment of the "first storage" of the present invention.

In FIG. 1, a transporting system 100 is provided with a rail 1, installed on or at a ceiling 101, a transporting carriage 2, a stocker (which is one example of the "storage" of the present invention) and a controller 20. The transporting system 100 drives the transporting carriage 2, and then performs transporting a FOUP 3 on the rail 1. The rail 1, which is an example of the "track" of the present invention, functions as a track for the transporting carriage 2 to travel thereon.

The transporting carriage 2 is the OHT (Overhead Hoist Transport) driven by, for example, a linear motor and transports the FOUP 3 to the stocker 10, a manufacturing equipment not shown, an OHT buffer, a large scale stocker, and the like. The transporting carriage 2 includes internally a hoist $2a$ which moves in the vertical direction.

Upon transporting, the hoist $2a$ holds a flange 4 of the FOUP 3 which is to be transported, by a holding mechanism for example. The hoist $2a$ is constructed to be able to move down and up in the vertical direction below the rail 1 by a hoisting mechanism such as a taking up and down belt and the like. Upon unloading or loading the FOUP 3 with the stocker 10, the hoist $2a$ moves to the position above a port for unloading and loading of the stocker 10. At the position where the hoist $2a$ moves down to the port, the hoist $2a$ holds or releases the flange 4. At this position, the bottom surface of the FOUP 3 contacts with the second putting surface (i.e., the floor surface of the port) described later.

As shown in FIG. 1 and FIG. 2, the FOUP 3, which is an example of "a load" of the present invention, is transported for unloading and loading with respect to the transporting carriage 2 (i.e., is transported in the storage) and for the adjustment of the storing position and so on.

As shown in FIG. 3A and FIG. 3S, the FOUP 3 has concave parts 5, 6 on the bottom surface. The concave part 5 is formed to have the size corresponding to a convex part 16 constructed in the rack 15 described later. On the other hand, the concave part 6 is formed to have the size corresponding to a convex part 12 constructed in a putting part 11 described later.

In FIG. 1 again, on the basis of the process schedule of a semiconductor device manufacturing for example, the controller 20 orders the transporting carriage 2 and the stocker 10 to transport, unload and load (which includes the transporting in the storage) the FOUP 3. In response to this order, the transporting carriage 2 and the stocker 10 are driven, the FOUP 3 is transported by the transporting carriage 2 and various processes is applied to the transported FOUP 3, so that the semiconductor device is manufactured.

The stocker 10 is an example of "a storage" of the present invention, is installed in adjacent to the rail 1 and stores a plurality of FOUPs 3.

In FIG. 2, the stocker 10 has: an in-storage transporting equipment including a putting portion (which is one example of the "supporting portion" of the present invention) 11, a horizontal driving portion 13 and a vertical driving portion 14; and a plurality of racks 15. The in-storage transporting equipment transfers the FOUP 3 between the racks 15. By this transferring, the FOUP 3 is put on the intended rack (i.e., a rack for storing or keeping) among the racks 15. Thus the FOUP 3 is stored in the stocker 10. Alternatively, as described later in detail, the FOUP 3 is transferred to a rack 15 which functions as a port for unloading and loading.

In order to transfer the FOUP 3 between the racks 15, the putting portion 11 is moved in the horizontal one direction by the horizontal driving portion 13, and is moved in the vertical direction by the vertical driving portion 14. The putting portion 11 has a first putting surface $11a$ at the top surface thereof. When transferring, the first putting surface $11a$ contacts with the bottom surface of the FOUP 3, and supports the FOUP 3 from its bottom side. On the first putting surface $11a$, the convex part 12 is formed as a supporting component. As shown in FIG. 3B, the convex part 12 is formed to have the size corresponding to the concave part 6 of the FOUP 3. When transferring, the convex part 12 is engaged to this concave part 6.

In FIG. 2 again, the horizontal driving portion 13 is driven on a horizontal guide 17 which extends in the horizontal one direction by a motor not illustrated for example. The horizontal driving portion 13 is connected with the putting portion 11 and moves back and forth the putting portion 11 along the horizontal guide 17 in the horizontal one direction D1.

The vertical driving portion 14 is driven on a vertical guide 18 which extends in the vertical direction by a motor not illustrated for example. To the vertical driving portion 14, the center portion of the horizontal guide 17 is fixed. The vertical driving portion 14 moves back and forth the horizontal gyide 17 along the vertical guide 18 in a vertical direction D2. When moving back and forth, the putting portion 11 is located at the center portion of the horizontal guide 17. In this manner, the putting portion 11 is moved in two axes direction of the vertical direction and the horizontal one direction by the horizontal driving portion 13 and the vertical driving portion 14.

The racks 15 is provided with total 14 racks of 7 stages in the vertical direction, 2 lines in the horizontal one direction and 1 line in the thickness direction. The putting portion 11 moves between these 14 racks 15. Then, transferring the FOUP 3 is performed. Each rack 15 has a second putting surface 15a on the top surface thereof. On this second putting surface 15a, the FOUP 3 is put. On the second putting surface 15a, a convex part 16 is formed as a supporting component. As shown in FIG. 3A, the convex part 16 is formed to have the size corresponding to the concave part 5 of the FOUP 3. When putting (as well as storing or keeping) the FOUP 3, the convex part 16 is engaged to this concave part 5.

In FIG. 2 again, one rack 15 among the 14 racks 15 (in other words, the second putting surface 15a which the one rack 15 has) functions as the port for unloading and loading to transfer the FOUP 3 with the transporting carriage 2. The rack 15, which is set as the port, is one of two racks existing on the top stage (i.e., one rack 15 located in an area P1 shown by a two dot chain line in FIG. 2). The main unit 10a of the stocker 10, located above and on the lateral side of this one rack 15, is opened so that the FOUP 3 can be unloaded and loaded therethrough.

Incidentally, not only one rack 15 set as a port, but also the putting portion 11 moved to the area P1 may be functioned as an additional port. Alternatively, the putting portion 11 may be functioned as the sole port in stead of the one rack 15. In this case, while the rack 15 is not disposed in the area P1, the putting portion 11 on which the FOUP 3 is not put is disposed in the area P11. Then the FOUP 3 is directly loaded from the transporting carriage 2 to the putting portion 11. Or when the putting portion 11 on which the FOUP 3 is put is disposed in the area P1, the FOUP 3 is directly unloaded to the transporting carriage 2 from the putting portion 11.

About the arrangement of the stocker 10, the rack 15 set as a port is arranged below the rail 1. In particular, the azimuth of the horizontal one direction in which the putting portion 11 is moved intersects perpendicularly to the azimuth of the rail 1.

Figure 4A:
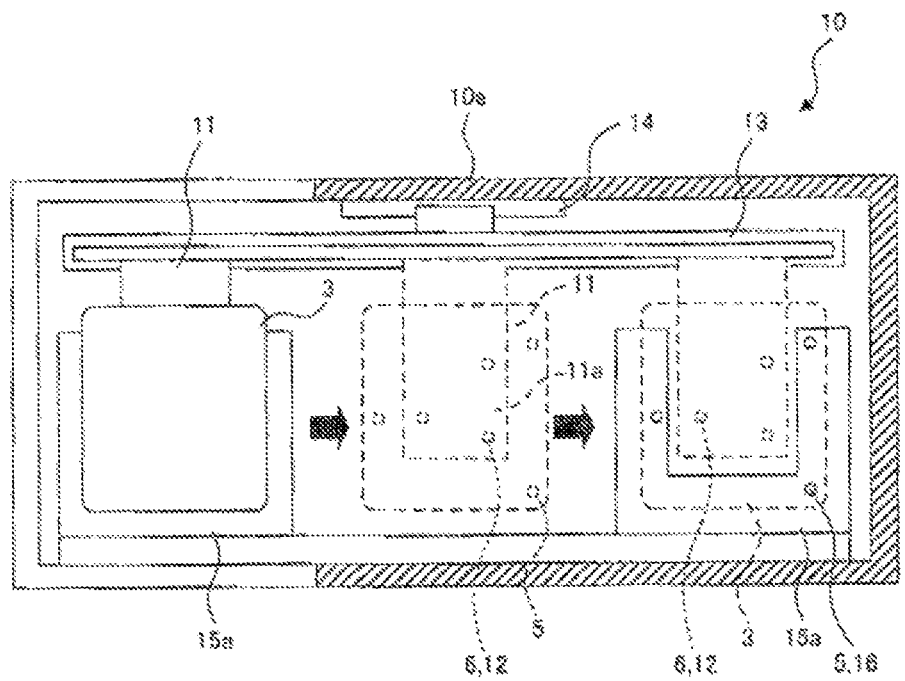
FIG. 4A is a plan view showing an operational condition in the horizontal one direction of a putting portion, in the embodiment of the present invention in one concrete example.

Next, referring to FIG. 4A, the figure of the first and second putting surfaces related to this embodiment will be explained. Here, FIG. 4A is a plan view shown a condition that the putting portion related to this embodiment moves in the horizontal one direction. In particularly, FIG. 4A corresponds to the A1-A1 cross section of FIG. 2 and shows two lines of the racks 15 (i.e., the second putting surface 15a) set at the top stage in the stocker 10.

As shown in FIG. 4A, when seen from above the stocker 10, the second putting surface 15a is formed into a U character like a horseshoe, and the first putting surface 11a is formed into a square like an island to occupy the center of the U character. Therefore the first putting surface 11a and the second putting surfaces 15a have respectively a flat shape complemented by each other. Between the first putting surface 11a and the second putting surfaces 15a like this, transferring the FOUP 3 is performed.

Figure 4B:
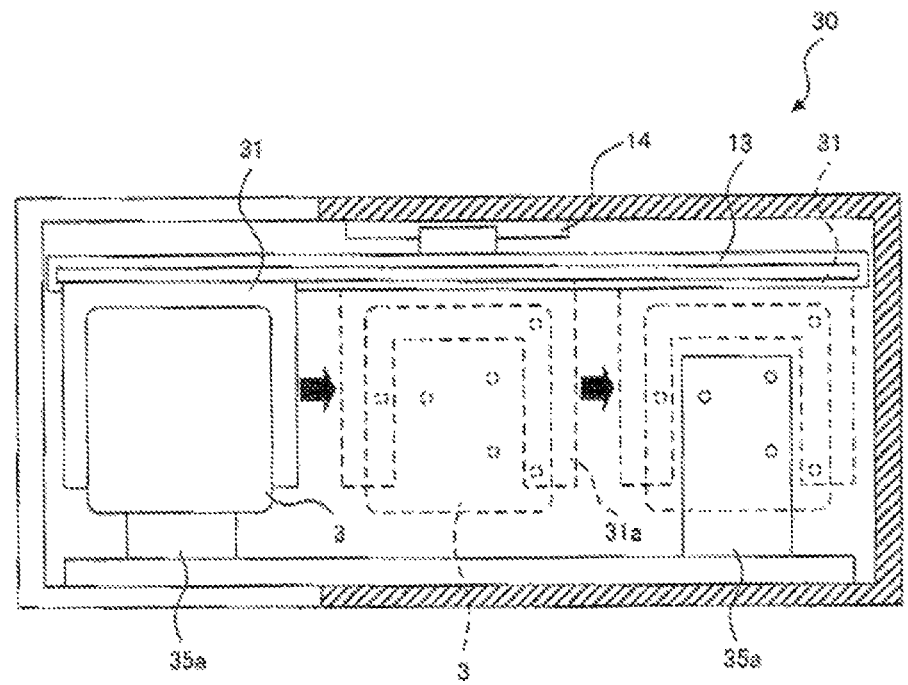
FIG. 4B is a plan view showing an operational condition in the horizontal one direction of a putting portion, in the embodiment of the present invention in a modified example.

Incidentally, in the example shown in FIG. 3A and FIG. 3B as well as FIG. 4A, when plainly seen, the first putting surface 11a lies inside the second putting surface 15a, the external diameter of the first putting surface 11a is smaller than that of the second putting surface 15a. However, conversely, the first putting surface 11a and the second putting surface 15a may be constructed such that the first putting surface 11a lies outside the second putting surface 15a, the external diameter of the first putting surface 11a is larger than that of the second putting surface 15a. In this case, as a modified example of the figures of the first putting surface 11a and the second putting surface 15a shown in FIG. 4A, as shown in FIG. 4B for examples when seen from above the stocker 30, the first putting surface 31a is formed into a U character like a horseshoe, and the second putting surface 35a is formed into a square like an island to occupy the center of the U character. In this manner, if the first putting surface 31a moved in the left and right and the up and down directions is made larger, the safety on the occasion of transportation in the storage while the FOUP 3 is put on the putting portion 31, is increased. This is helpful to prevent drop and jounce of the FOUP 3.

(In-Storage Transporting Operation)

Next, referring to the drawings still from FIG. 2 to FIG. 4B, transferring the load in the storage related to this embodiment, that is, the operation of in-storage transporting (i.e., the transporting within the storage) is explained.

In FIG. 2 as well as FIG. 4A and FIG. 48, the FOUP 3, which is loaded by the transporting carriage 2 and is putting on one second putting surface 15a in the area P1, is transferred to another second putting surface 15a (that is, in FIG. 2 as well as FIG. 4A and FIG. 4B, it shown in an area P2) in the same stage. In this case, firsts the putting portion 11, (which is shown by the broken line in FIG. 2) which has finished transporting the FOUP 3 onto the second putting surface 15a in an area P3, is moved just under the second putting surface 15a in the area P1. At this occasion, the putting portion 11 is moved to an approximate center of the horizontal guide 17 by the horizontal driving portion 13, and after that, the putting portion 11 is moved to the predetermined vertical position along the vertical guide IS by the vertical driving portion 14. This predetermined vertical position is below the second putting surface 15a in the area P1. After that, the putting portion 11, existing at the predetermined vertical position, is moved to the predetermined horizontal position (which is shown by the solid line in FIG. 2) along the horizontal guide 17 by the horizontal driving portion 13. As shown in FIG. 3A, this predetermined horizontal position is a position where the convex part 12 of the putting portion 11 exists on the lower side in the vertical direction of the concave part 6 of a FOUP 3.

The putting portion 11, which has been moved to the predetermined vertical position and horizontal position, is then moved upwards by the vertical driving portion 14. By moving upwards the first putting surface 11a passes through the center of the second putting surface 15a. Then, as shown in FIG. 3B, the first putting surface 11a becomes higher than the second putting surface 15a. At this time, the engagement of the concave part 5 and the convex part 16 is disengaged. Then, in place of the second putting surface 15a, the FOUP 3 is supported on the first putting surface 11a, and the convex part 12 of the putting portion 11 and the concave part 6 of the FOUP 3 are engaged with each other. Thus the FOUP 3 is transferred from the second putting surface 15a to the first putting surface 11a.

The putting portion 11 on which the FOUP 3 has been transferred is moved right above the second putting surface 15a in the area P2. At this occasion, the putting portion 11 is moved to the predetermined horizontal position in the horizontal one direction by the horizontal driving portion 13. The predetermined horizontal position is a position where the concave part 5 of the FOUP 3 exists on the upper side in the vertical direction of the convex part 16 of the second putting surface 15a in the area P2. The putting portion 11, which has been moved to the predetermined horizontal position, is moved downwards by the vertical driving portion 14. By moving downwards, the first putting surface 11a passes through the center of the second putting surface 15a in the area P2. Then, as shown in FIG. 3A, the first putting surface 11a becomes lower than the second putting surface 15a. At this time, the engagement of the convex part 12 and the concave part 6 in the area P2 is disengaged. By this, the FOUP 3 is supported on the second putting surface 15a in place of the first putting surface 11a, and the concave part 5 of the FOUP 3 and the convex part 16 of the second putting surface 15a are engaged with each other. Thus the FOUP 3 is transferred from the first putting surface 11a to the second putting surface 15S in the area P2. For this reason, the operation of transferring of the FOUP 3 from the area P1, which is set as a port, to the area P2 is completed. Incidentally, if the operation of transferring is performed in the inverse process, transferring from the area P2 to the area P1 is operated. Therefore, the above described operation of transferring through the port is also the operation for unloading and loading the FOUP 3 between the transporting carriage 2 and the stocker 10.

As described above, according to the stocker 10 in this embodiment, the stocker 10 extends in the vertical direction and the horizontal one direction, and the stocker 10 is constructed extremely thin, including the space needed for the thickness of one FOUP 3 and the movement of the horizontal driving portion 13 and the vertical driving portion 14, in the thickness direction. For this reason, into an even relatively small space along the rail 1, the stocker 10 can be disposed. The putting portion 11 which moves in the 2 axes directions is not needed when unloading and loading between the port and the transporting carriage 2, and the putting portion 11 does not interfere the operation of unloading and loading. Thus it is possible to unload and load the FOUP 3 efficiently and is also possible to perform the in-storage transportation efficiently, by use of a simple structure.

Incidentally, in this embodiment, the stocker 10 is disposed in such a manner that the azimuth of the horizontal one direction, in which the putting portion 11 is moved, perpendicularly crosses to the azimuth of the rail 1. However, the stocker 10 may be disposed in such a manner that the azimuth of the horizontal one direction is parallel to the azimuth of the rail 1.

<Second Embodiment>

Figure 5:
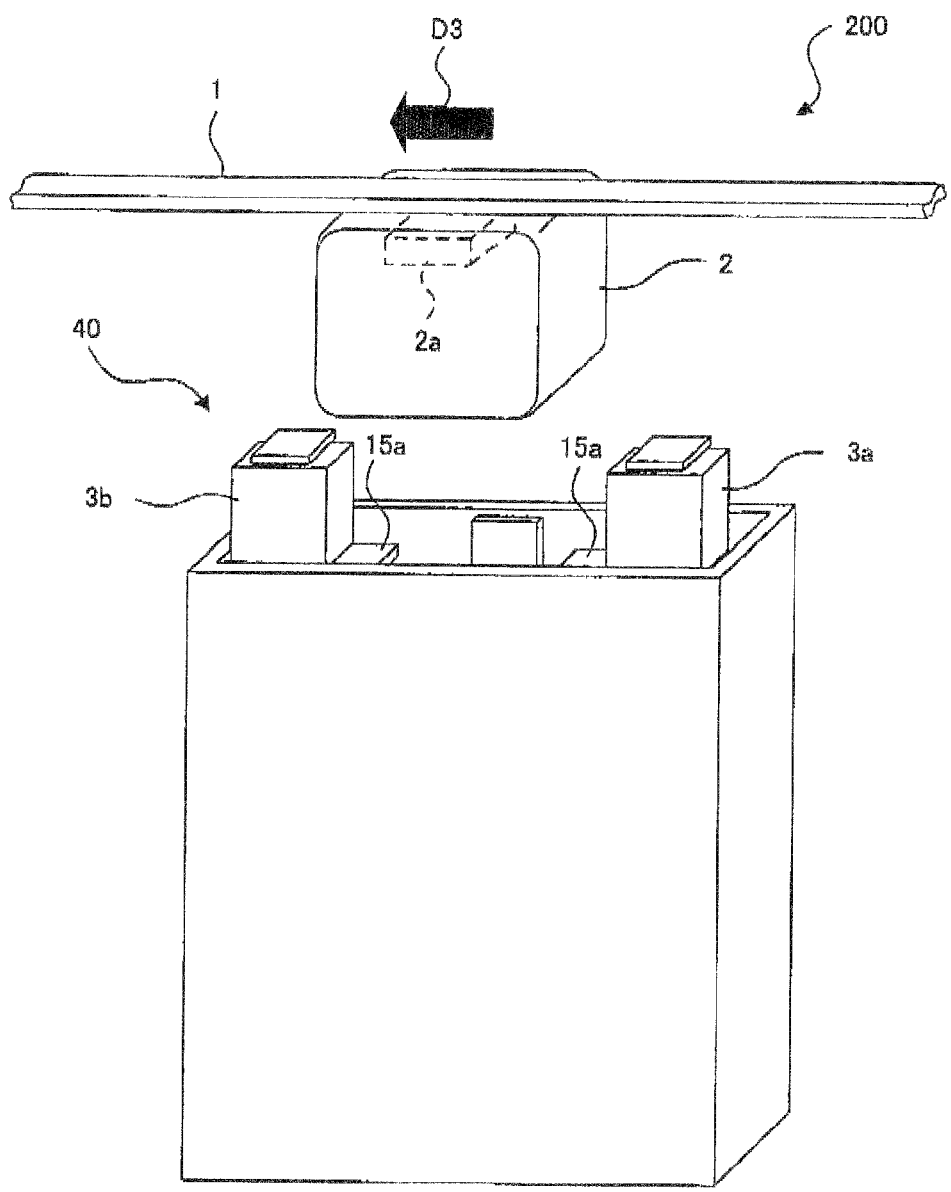
FIG. 5 is a perspective view showing an appearance of a transporting system including a storage, in the second embodiment of the present invention.

Next, as the second embodiment in this invention, a modified example of the storage of the first embodiment is explained with referring to FIG. 5. Here, FIG. 5 is a perspective view showing an external appearance of the transporting system provided with the storage of the second embodiment, whose general purpose is the same as that of FIG. 1. In particular, in the storage shown in FIG. 5, a port for unloading and a port for loading are set separately and the horizontal one direction in which the putting portion is moved is disposed in parallel to the track. Incidentally, in the transporting system shown in FIG. 5, the same constitutional elements as those in the transporting system 100 shown in FIG. 1 carry the same reference numerals and the explanations thereof are omitted.

Especially, the second embodiment is another embodiment of the "first storage" of the present invention.

In FIG. 5, the transporting system 200 is provided with the rail 1, the transporting carriage 2 and a stocker 40. The transporting system 200, in the same manner as the transporting system 100 shown in FIG. 1, drives the transporting carriage 2, and transports the FOUP 3 over the rail 1. The transporting carriage 2 travels in the traveling direction D3 when performing the transportation on the rail 1.

The stocker 40 is provided with the in-storage transporting equipment (refer to FIG. 2 to FIG. 5) and a plurality of racks 15. Two racks (i.e., the second putting surfaces 15a) on the top stage among the racks 15 function a port for unloading and a port for loading respectively. The second putting surface 15a set as a port for loading (i.e., taking in the FOUP 3 into the stocker 40) in the two racks on the top stage is located at the upstream side of the traveling direction D3. The second putting surface 15a set as a port for unloading (i.e., taking out the FOUP 3 from the stocker 40) is located at the downstream side of the traveling direction D3. The main body of the stocker 40, facing to the upper side and the lateral side of these second putting surfaces 15a, is opened to the air so as to allow unloading and loading of the FOUP 3.

The stocker 40 is disposed in such a manner that the two second putting surfaces 15a set as ports for unloading and loading respectively are under the rail 1 and along the rail 1. The stocker 40 is disposed such that the azimuth in which these second putting surfaces 15a are arranged (i.e., the azimuth of the horizontal one direction in which the putting portion is moved on the two second putting surfaces 15a) is in parallel to the azimuth of the rail 1.

(Unloading and Loading Operation Using the Ports for Unloading and Loading)

Next, the operation for unloading and loading between the storage of the present embodiment and the transporting carriage will be explained.

In FIG. 5, between the stocker 40 and one transporting carriage 2, the loading of the first FOUP 3a and the unloading of the second FOUP 3b different from the first FOUP 3a is continuously performed. In this case, first, the transporting carriage 2 holding the first FOUP 3a is moved to the stocker 40 from the upstream side in the traveling direction DS. Then, the transporting carriage is stopped at a position directly above the second putting surface 15a set as a port for loading (i.e., transferring or taking in the FOUP 3 into the stocker 40). The hoist 2a holding the first FOUP 3a is moved to the predetermined vertical position. Then, the first FOUP 3a is released from the hoist 2a. The first FOUP 3a is put on the port for loading (i.e., the second putting surface 15a of the rack 15 set as a port for loading). By this putting, the first FOUP 3a is loaded into the stocker 40. Just after loading the first FOUP 3a or after unloading the second FOUP 3b described later, the in-storage transporting of the first FOUP 3a loaded is performed in the same manner as the stocker 10 in the first embodiment.

Successively, as shown in FIG. 5, the transporting carriage 2, which has released the first FOUP 3a, is traveled in the traveling direction D3. The transporting carriage 2 is stopped at a position directly above the second putting surface 15a set as a port for unloading (i.e., transferring or taking out the FOUP 3 from the stocker 40). The hoist 2a is moved to the predetermined vertical position. Then, the second FOUP 3b is hoisted by the hoist 2a. By holding, the second FOUP 3b is unloaded Just before unloading or before the transporting carriage 2 comes to the port for unloading, the in-storage transporting of the second FOUP 3b to be unloaded is performed in the same manner as the stocker 10 in the first embodiment. After unloading, the transporting carriage 2 holding the second FOUP 3b is traveled in the traveling direction D3. By this, one series of loading and unloading operations is completed.

As mentioned above, according to the stocker 40 in the second embodiment, the port for unloading and the port for loading are set separately. Just after the first FOUP 3a has been loaded from the transporting carriage 2 onto the port for loading of the stocker 40, the second FOUP 3b is unloaded from the port for unloading from the stocker 40 onto the transporting carriage 2 without load. Thus the efficiency for unloading and loading is made extremely high. In such a case that the wall in the factory interferes so that the normal stocker cannot be installed, the stocker 40 is disposed as the azimuth of the horizontal one direction in which the putting portion is moved is in parallel to the azimuth of the rail 1. Then, as long as the rail gets away from the wall for the thickness in the thickness direction of the thin stocker, the stocker 40 can be disposed without any problem.

Figure 6:
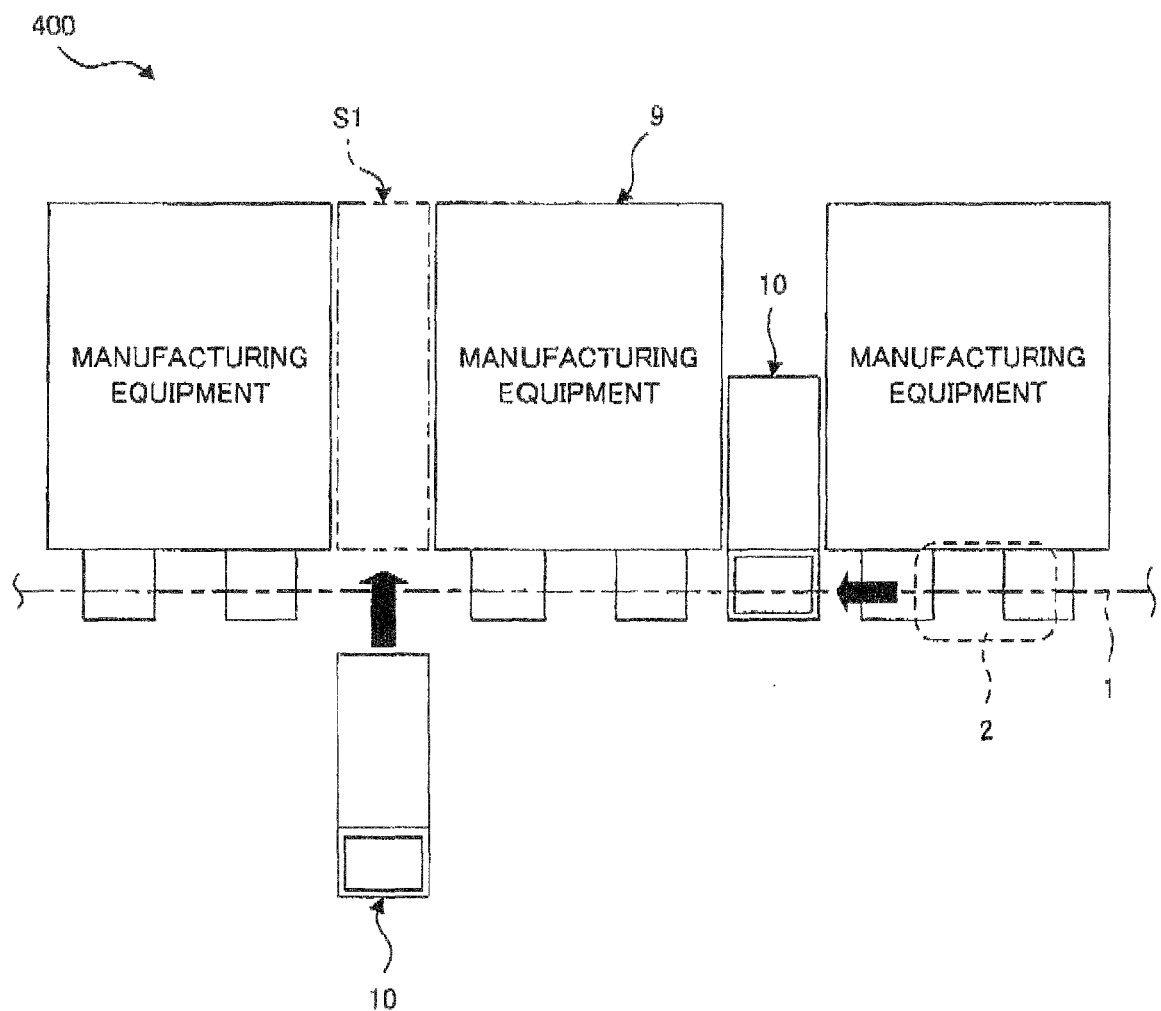
FIG. 6 is a plan view showing a practical arrangement condition of the storage in the first embodiment.

Next, referring to FIG. 6, the arrangement of the storage is explained. Here, the FIG. 6 is a plan view showing a condition of arranging As shown in FIG. 6, the storage is arranged in the space between the manufacturing equipments, and the like, set along the track in the factory of, for example, a semiconductor manufacturing factory and the like. The size of the stocker 10 in the thickness direction is designed corresponding to the space (or gap) between the manufacturing equipments 9. Between the manufacturing equipments 9, the space SI for maintenance is reserved. Inserting the stocker 10 into the space Si, the space SI, which may be called as a wasted space except the time of maintenance, is used effectively. The manufacturing equipments 9 and the stocker 10 arranged between these manufacturing equipments 9 are arranged with respect to the rail 1 in such a manner that the horizontal one direction, in which the putting portion is moved, perpendicularly crosses.

Incidentally, in the second embodiment, two ports for unloading and loading are arranged below one rail 1. These two ports may be arranged below two rails respectively.

<Third Embodiment>

Figure 7:
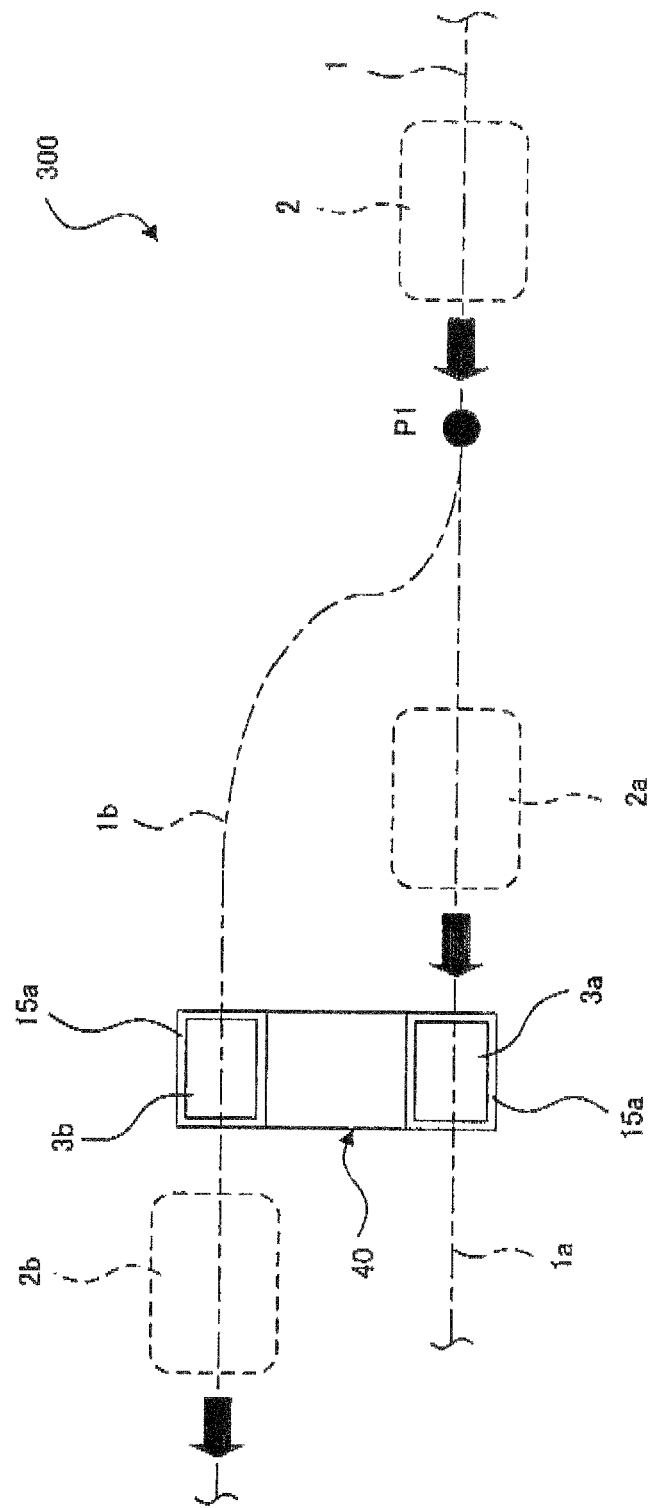
FIG. 7 is a plan view showing a track of a transporting system, in the third embodiment of the present invention.

Next, as the third embodiment in the present invention, the modified example of the arrangement of the storage of the second embodiment is explained. Here, FIG. 7 is a plan view showing the track of the transporting system of the third embodiment. In particular, FIG. 7 is the track to the two ports which the storage of the second embodiment has. Incidentally in the transporting system shown in FIG. 7, the same constitutional elements as those in the transporting system 200 shown in FIG. 5 carry the same reference numerals and the explanations thereof are omitted.

Especially, the third embodiment is one embodiment of the "second storage" of the present invention.

In FIG. 7, the transporting system 300 is provided with the rail 1, the transporting carriage 2 and the stocker 40. The transporting system 300 controls the transporting carriage 2 and the stocker 40 by the controller not illustrated to thereby perform the transportation of the FOUP 3 on the rail 1.

The rail 1 branches off at the upper stream side (which is illustrated as a bifurcated point P1 in FIG. 7) of the stocker 40. The rail 1 has a first bifurcated rail 1a and a second bifurcated rail 1b at the lower stream side of the bifurcated point P1. The first bifurcated rail 1a is a rail to load the first FOUP 3a into the stocker 40. The second bifurcated rail 1b is a rail to unload the second FOUP 3b from the stocker 40.

The transporting carriage 2 has the transporting carriage 2a for loading and the transporting carriage 2b for unloading. The transporting carriage 2a for loading travels along the first bifurcated rail 1a after the bifurcated point P1, and transports the first FOUP 3a from the upper stream side of the stocker 40 to the port for loading. The transporting carriage 2b for unloading travels along the second bifurcated rail 1b after the bifurcated point P1, and transports the second FOUP 3b from the port for unloading of the stocker 40 to the lower stream side.

As for the stocker 40, the two second putting surfaces 15a on the top stage function respectively as ports for unloading and loading. The second putting surface 15a set as a port for loading is located below the first bifurcated rail 1a. The second putting surface 15a set as a port for unloading is located below the second bifurcated rail 1b. Incidentally, the two putting surfaces 15 may not function as ports for unloading and loading separately. Instead, the two putting surfaces 15 may have the same function as a port for unloading and loading.

(Unloading and Loading Operation of the Transporting System in Which Two Rails Correspond to Two Ports)

Next, the operation of unloading and loading of the transporting system of the third embodiment will be explained with referring to FIG. 7.

In the FIG. 7, in the transporting system 300 using two rails 1a, 1b corresponding two ports, the unloading and the loading are performed concurrently or in parallel. In this case, first, when the transporting carriage 2 has arrived at the bifurcated point P1, the path after the bifurcated point P1 of the transporting carriage 2 is controlled. If the transporting carriage 2 is a transporting carriage 2a for loading, the transporting carriage 2a for loading travels along the first bifurcated rail 1a and comes to the stocker 40. Then the transporting carriage 2a for loading stops directly above the second putting surface 15a set as a port for loading. Then, the first FOUP 3a which the transporting carriage 2a holds is put onto the port for loading. By this putting operation, the first FOUP 3a is loaded into the stocker 40. After that, the transporting carriage 2a for loading travels to the down stream of the first bifurcated rail 1a.

On the other hand, if the transporting carriage 2 is a transporting carriage 2b for unloading, the transporting carriage 2b for unloading travels along the second bifurcated rail 1b and comes to the stocker 40. Then the transporting carriage 2b for unloading stops directly above the second putting surface 15a set as a port for unloading. Then, the second FOUP 3b which is put on the port for unloading is held by the transporting carriage 2b. By this holding, the second FOUP 3b is unloaded from the stocker 40 to the transporting carriage 2b for unloading. After that, the transporting carriage 2b for unloading travels to the down stream of the second bifurcated rail 1b.

As mentioned above, according to the third embodiment, two ports are set up on the top stage of the stocker 40, and the transporting carriages 2 travel respectively along two rails 1a, 1b corresponding to these two ports. Thus the operation for unloading and the operation for loading can be concurrently performed and the transferring efficiency can be extremely improved.

Additionally, although the stocker 10 shown in FIG. 6 is arranged alone, in line with the space between manufacturing equipments, the stocker 10 may be arranged in the form of the stocker set consisting of a plurality of stockers.

<Fourth Embodiment>

Figure 8:
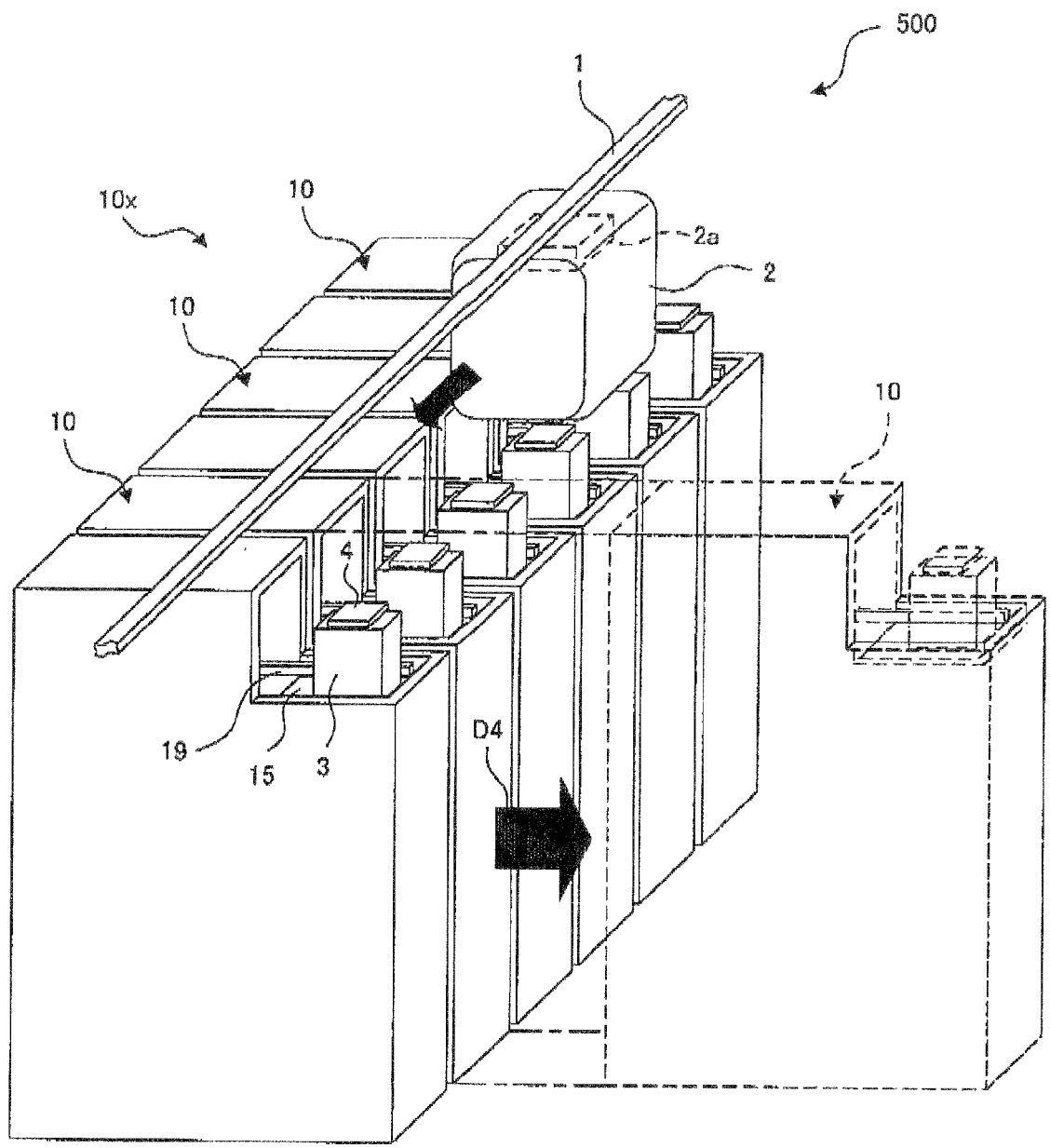
FIG. 8 is a perspective view showing an appearance of a transporting system including a storage set, in the forth embodiment of the present invention.

Next, as the forth embodiment of the present invention, a storage set constructed by combining a plurality of storages of the first embodiment is explained with referring to FIG. 8. Here, FIG. 8 is a perspective view showing the external appearance of the transporting system including the storage set of this embodiment, whose general purpose is the same as that of FIG. 1. Incidentally, in the transporting system shown in FIG. 8, the same constitutional elements as those in the transporting system 100 shown in FIG. 1 carry the same reference numerals and the explanations thereof are omitted.

Especially, the forth embodiment is an embodiment of the "storage set" of the present invention.

In FIG. 8, the transporting system 500 is provided with the rail 1, the transporting carriage 2 and a stocker set 10x. The transporting system 500 drives the transporting carriage 2 to thereby perform the transportation of the FOUP 3 on the rail 1 by a controller not illustrated in the same manner as the transporting system 100 shown in FIG. 1

The stocker set 10x has six stockers 10. Each stocker 10 includes an in-storage transporting equipment 19 including the putting portion not illustrated and the racks 15, in the same manner as in the stocker 10 shown in FIG. 1. The in-storage transporting equipment 19 moves the putting portion by the driving portion in the two axes directions of the horizontal one direction and the vertical direction. Thus the in-storage transporting equipment 19 transfers the FOUP 3 between the racks 15. One rack 15 located on the top stage of the racks 15 (i.e., the rack on which the FOUP 3 is put in FIG. 8) functions as a port for unloading and loading.

The six stockers 10 included in the stocker set 10x are arranged such that the racks 15 for unloading and loading are arranged in one line below the rail 1 and along the rail 1. Each stocker 10 is arranged such that the azimuth of the horizontal one direction in which the putting portion is moved perpendicularly crosses the azimuth of the rail 1.

(Loading and Unloading Operation in the Stocker Set)

The operation for unloading and loading between the transporting carriage 2 and the stocker set 10x in the forth embodiment, will be simply explained.

In the FIG. 8, when each of 6 stockers 10 in the stocker set 10x stores the FOUP 3 different from each other, the transporting carriage 2 travels back and forth between (i) the narrow area where the rail 1 exists in correspondence with the stocker set 10x and (ii) the destination of each FOUP 3. Then unloading and loading the different 6 FOUPs 3 can be performed. In this case, the FOUP 3 of the second stocker 10, which is arranged on the downstream side of the first stocker 10, can be unloaded by the transporting carriage 2, which has just finished loading to the first stocker 10, which is arranged on the upstream side of the rail 1. Further, when a plurality of transporting carriages 2 travel to this stocker set 10x, unloading and loading the 6 FOUPs 3 can be simultaneously performed at the 6 stockers 10.

As described above, according to the forth embodiment, the storage set 10x, in which the total number of the stockers 10 is adjusted, can be appropriately arranged into a relatively small space or a large space along the rail 1. The stockers 10 constituting the stocker set 10x are arranged such that the ports in the stockers 10 are arranged in one line along the rail 1. For this reason, the operation for unloading and loading can be performed to any port by the transporting carriage 2 which travels on the rail 1, so that the transferring efficiency is extremely high.

The present invention is not limited to the embodiments described above. The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosures of Japanese Patent Application No. 2007-231862, No. 2007-231868 and No. 2007-231870 filed on Sep. 6, 2007 including the specification, claims, drawings and Summary are incorporated herein by reference in their entireties.

What is claimed is:

1. A storage, comprising:
a supporting portion configured to support a load, the supporting portion being a putting portion having a first putting surface configured to support said load from a bottom side of said load;
a horizontal driving portion configured to move said supporting portion back and forth in a first horizontal direction;
a vertical driving portion configured to move said supporting portion back and forth in a vertical direction;
a rack having a plurality of second putting surfaces each configured to transfer said load mutually with said first putting surface of the supporting portion, said rack having only one line in another horizontal direction, said second putting surfaces being disposed at a plurality of stages in the vertical direction at which said supporting portion can access each of the second putting surfaces by said horizontal driving portion, at least one of said second putting surfaces being disposed at a horizontal position at which said supporting portion can access the at least one of said second putting surfaces by said horizontal driving portion, at least one of said second putting surfaces being located at a top stage of said stages in said rack functioning as a port to unload and load said load with a transporting carriage which travels along a track and moves the load down and up in the vertical direction below the track, said first putting surface of the putting portion additionally functioning as said port with the at least one of said second putting surfaces;
a first putting line in which at least some of the second putting surfaces are located in the first putting line in the vertical direction, the second putting surfaces of the first putting line located at the top stage of said stages functioning as the port;
a moving line in which the load is moved back and forth in the vertical direction by the vertical driving portion; and
a second putting line in which at least some other second putting surfaces are located in the vertical direction and which does not include the port,
wherein the first putting line, the moving line, and the second putting line lie next to one another in the first horizontal direction, and
an azimuth of the first horizontal direction intersects perpendicularly to an azimuth of the track.

2. The storage according to claim 1, wherein said rack has two of said second putting surfaces at each of said stages configured to support said load when said supporting portion is moved to both lateral sides respectively in said first horizontal direction.

3. The storage according to claim 1, wherein each of said first putting surface and said second putting surfaces has a flat shape complemented by each other as viewed from said vertical direction, when said putting portion is moved to one lateral side in said first horizontal direction.

4. The storage according to claim 1, wherein said load includes a regulated concave part and a regulated convex part in said bottom side, and said first putting surface and said second putting surfaces including, respectively, a concave part and a convex part configured to engage said regulated concave part and said regulated convex part.

5. The storage according to claim 1, wherein the storage is disposed with respect to the track along which the transporting carriage transports said load, in such a manner that an azimuth of said horizontal one direction is parallel to an azimuth of said track.

6. The storage according to claim 5, wherein the storage is disposed in such a manner that said rack is located under said track, and among said two of said second putting surfaces, which are located at the top stage of said rack, one located upstream of said track functions as said port for loading, and another located downstream of said track functions as said port for unloading.

7. A storage for unloading and loading a load with a transporting carriage which transports said load on a track, said storage comprising:
a driving device configured to move said load back and forth in a first horizontal direction and a vertical direction;
a rack having a plurality of rack portions in said first horizontal direction for each stage over a plurality of stages in said vertical direction, said rack has only one line in another horizontal direction, each of said rack portions configured to accommodate or put said load which is moved by said driving device, said rack being disposed with respect to said track in such a manner that an azimuth of said first horizontal direction perpendicularly intersects an azimuth of said track, at least one of said rack portions located at a top stage of said stages in said rack functioning as said port to unload and load said load with said transporting carriage which moves said load down and up in said vertical direction below said track,
a first putting line in which said plurality of rack portions is located in said vertical direction, the rack portions of the first putting line located at the top stage of the stages functioning as the port;
a moving line in which said load is moved back and forth in said vertical direction by said driving device; and
a second putting line in which a plurality of putting surfaces are located in the vertical direction and which does not include the port,
wherein the first putting line, the moving line, and the second putting line lie next to one another in the first horizontal direction.

8. The storage according to claim 7, wherein said transporting carriage comprises a ceiling traveling type carriage configured to travel along said track installed on or at the vicinity of a ceiling, and said rack is disposed with respect to said track to be located below said track.

9. The storage according to claim 7, wherein the driving device comprises a supporting portion configured to support said load,
a horizontal driving portion configured to move said supporting portion back and forth in said first horizontal direction, and
a vertical driving portion configured to move said supporting portion back and forth in said vertical direction,
wherein the rack has as said rack portions the plurality of putting surfaces, each putting surface being configured to transfer said load mutually with said supporting portion, at least one of said putting surfaces being disposed at a horizontal position at which said supporting portion can access the one or more putting surfaces by said horizontal driving portion, for each of said stages.

10. The storage according to claim 7, wherein said track diverges at an upstream side of the storage, said rack is disposed below said track, and two of said rack portions, located at the top stage of said rack, function respectively as a port for unloading and loading, with respect to the track on a downstream side of a position where said track diverges.

11. A transporting system comprising:
(i) a storage configured to unload and load a load with a transporting carriage which transports said load on a track, said storage comprising:
a driving device configured to move said load back and forth in a horizontal direction and a vertical direction,
a rack having a plurality of rack portions in said horizontal direction for each stage over a plurality of stages in said vertical direction, each of said rack portions configured to accommodate or receive said load which is moved by said driving device, said rack being disposed with respect to said track in such a manner that an azimuth of said horizontal direction perpendicularly intersects to an azimuth of said track,
a first putting line in which at least some of the rack portions are located in the vertical direction, the rack portions of the first putting line located at a top stage of the stages, said top stage functioning as a port to unload and load said load with said transporting carriage which moves said load down and up in said vertical direction below said track,
a moving line in which the load is moved back and forth in the vertical direction by a vertical driving portion, and
a second putting line in which at least some other rack portions are located in the vertical direction and which does not include the port;
(ii) said track; and
(iii) said transporting carriage,
wherein at least one of said rack portions, which is located at said top stage of said stages in said rack, functions as said port,
wherein the first putting line, the moving line, and the second putting line lie next to each other in the horizontal direction.

* * * * *